United States Patent [19]

Jonsson

[11] Patent Number: 5,457,377
[45] Date of Patent: Oct. 10, 1995

[54] METHOD OF MONITORING THE INTERNAL IMPEDANCE OF AN ACCUMULATOR BATTERY IN AN UNINTERRUPTIBLE POWER SUPPLY, AND AN UNINTERRUPTIBLE POWER SUPPLY

[75] Inventor: Lennart Jonsson, Sverige, Sweden

[73] Assignee: FPS Power Systems OY AB, Espoo, Finland

[21] Appl. No.: 122,678

[22] Filed: Sep. 17, 1993

[30] Foreign Application Priority Data

Oct. 1, 1992 [FI] Finland ................................. 924425

[51] Int. Cl.6 ..................................................... H01M 10/48
[52] U.S. Cl. .................. 320/5; 320/31; 320/48; 324/430
[58] Field of Search ......................... 320/5, 9, 10, 14, 320/31, 32, 39, 40, 48; 307/46, 64, 66; 324/430, 426

[56] References Cited

U.S. PATENT DOCUMENTS

| | | |
|---|---|---|
| 4,217,533 | 8/1980 | Van Beek . |
| 4,270,080 | 5/1981 | Kostecki . |
| 4,423,379 | 12/1983 | Jacobs et al. ..................... 324/429 |
| 4,697,134 | 9/1987 | Burkum et al. ..................... 320/48 |
| 4,719,427 | 1/1988 | Morishita et al. . |
| 4,742,290 | 5/1988 | Sutphin et al. . |
| 5,137,020 | 8/1992 | Wayne et al. ..................... 128/419 PS |
| 5,148,043 | 9/1992 | Hirata et al. ..................... 307/66 |
| 5,168,205 | 12/1992 | Kan et al. . |
| 5,193,067 | 3/1993 | Sato et al. ..................... 320/39 X |
| 5,229,650 | 7/1993 | Kita et al. . |
| 5,281,919 | 1/1994 | Palanisamy . |

FOREIGN PATENT DOCUMENTS

| | | |
|---|---|---|
| 2809514 | 9/1978 | Germany . |
| 3321649A1 | 12/1983 | Germany . |
| 2185326 | 10/1986 | United Kingdom . |

OTHER PUBLICATIONS

Xia, "Ordinary Meter Measures Battery Resistance", EDN-Design Ideas (Jun. 24, 1993).

Primary Examiner—Kristine L. Kincaid
Assistant Examiner—Edward Tso
Attorney, Agent, or Firm—Foley & Lardner

[57] ABSTRACT

A method of monitoring the internal impedance of an accumulator battery in an uninterruptible power supply, and a UPS. In accordance with the invention, during the discharge of the battery to the load, the load current induced by the load and passing through the battery is measured or calculated, and the corresponding AC voltage component obtained on the battery voltage is measured, the value for the internal impedance of the battery being calculated from these values. The obtained impedance value is compared to a predetermined reference value to determine the condition of the battery.

11 Claims, 2 Drawing Sheets

METHOD OF MONITORING THE INTERNAL IMPEDANCE OF AN ACCUMULATOR BATTERY IN AN UNINTERRUPTIBLE POWER SUPPLY, AND AN UNINTERRUPTIBLE POWER SUPPLY

BACKGROUND OF THE INVENTION

The present invention relates to a method of monitoring the internal impedance of an accumulator battery in an uninterruptible power supply, and to an uninterruptible power supply.

In uninterruptible power supplies (UPS) for computers and other apparatus that are sensitive to power interruptions and the like, the reserve energy source in general consists of a series of lead acid cells that, in a case of power interruption, can be rapidly connected electronically via an inverter and thereby AC current can be supplied to the system connected to the UPS. The purpose of the UPS is partly to bridge shorter power interruptions, partly to signal the data system in cases of mains interruptions of longer duration, so the computer can be shut down automatically in a controlled manner without damage, e.g., lost files, before the limited energy stored in the battery is completely exhausted.

In certain known UPSs, the condition and charging of the battery is hardly supervised at all, but is controlled by means of continuous charging voltage (float charge) that must be sufficiently high to charge all cells in the battery but not so high as to overcharge any of the cells. Undercharging of the battery may result in sulphatation ($PbSO_4$) of the electrode plates in the cells. Such sulphate build-up is a normal and reversible discharge process in a lead acid battery, but in a continuous undercharge condition also non-recoverable sulphate crystals degrading the capacity of the battery are created. Overcharging in turn may result in drying out of the electrolyte of the battery and cause elevated corrosion of the electrode grids and associated conductors. Overcharging may further cause bridging phenomena finally resulting in short circuiting between the electrodes. Also overheating of individual battery cells may occur, particularly with several series connected battery cells, as variations in the individual voltages of the cells may appear.

Other known solutions utilize individual cell-voltage measurements, but the associated hardware and installations are expensive. Further, it is a known fact that potential battery failures are best detected during discharge, particularly near the point when the nominal capacity of the battery is nearly totally exhausted, i.e., where variations in the charged capacity are readily apparent. There are also applications in which deliberate discharge of the battery is performed for a certain period of time, but the discharge that is required to achieve a reliable estimate of the battery capacity must be weighed against the risk of power interruptions when the battery is in its discharged state. In critical applications, this risk is not acceptable.

It is also known that the internal impedance of a battery, expressed for instance as the value of an AC voltage applied over the battery divided by the AC current obtained in the battery, is an indicator of the general condition of the battery. The internal impedance of a battery increases with increasing sulphatation of the electrodes, corrosion of conductors, etc., and with increased drying out of electrolyte in the battery. The internal impedance of the battery therefore constitutes an important indicator of the performance of the battery. However, there is no known system available that would measure this impedance in a simple manner.

SUMMARY OF THE INVENTION

It is an object of the present invention to provide a method and an apparatus for measuring the internal impedance of an accumulator battery in a UPS in a simple and reliable way. To achieve this, the method of the invention is characterized in that during the discharge of the battery to the load, the current induced by the load, passing through the battery, is measured or calculated, and the corresponding AC voltage component obtained on the battery voltage is measured: The value for the internal impedance of the battery being calculated from these values, and that the obtained impedance value is compared to a predetermined reference value to determine the condition of the battery.

BRIEF DESCRIPTION OF THE DRAWINGS

Preferred embodiments of the method and UPS of the invention are set forth in the ensuing claims. In the following, the invention will be explained in more detail with reference to the accompanying drawings, in which

DETAILED DESCRIPTION OF THE PREFERRED EMBODIMENTS

Figure 1:
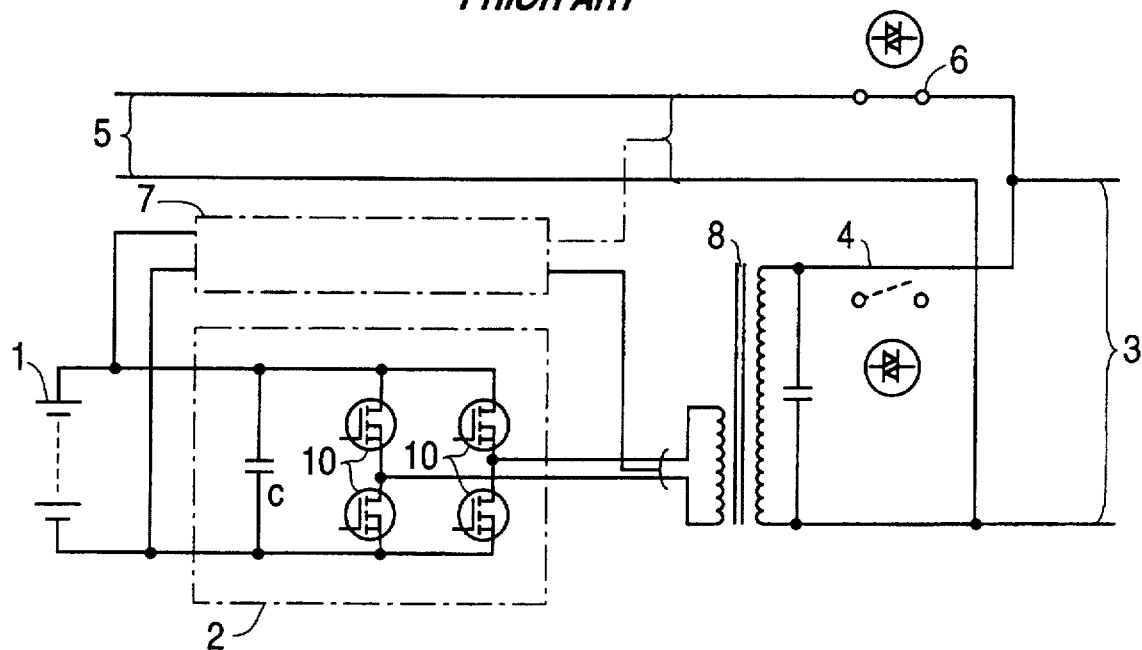
FIG. 1 shows a conventional UPS.

FIG. 1 shows a conventional UPS wherein the battery 1 and the associated inverter 2 are normally disconnected from the output 3 of the UPS by means of a switch 4. The load is in this operational mode supplied directly from the mains supply 5. At a mains interruption, the mains supply is disconnected by switch 6, the inverter 2 is activated and connected to the load through switch 4. After mains voltage recovery, the initial state is resumed, and the charger 7 recharges the battery 1. The purpose of the transformer 8 is primarily to transform the output voltage of the inverter into a suitable load voltage during mains interruption. It can also provide energy from the load voltage to the charger 7 under normal conditions, if there is no switch 4. The switch 4 can be replaced by the switching functions of the semiconductor switches 10 of the main circuit of the inverter. A modern UPS usually also includes a logic unit performing various control functions of the different components of the UPS and also provides the necessary warning signals to users of the connected system.

Figure 2:
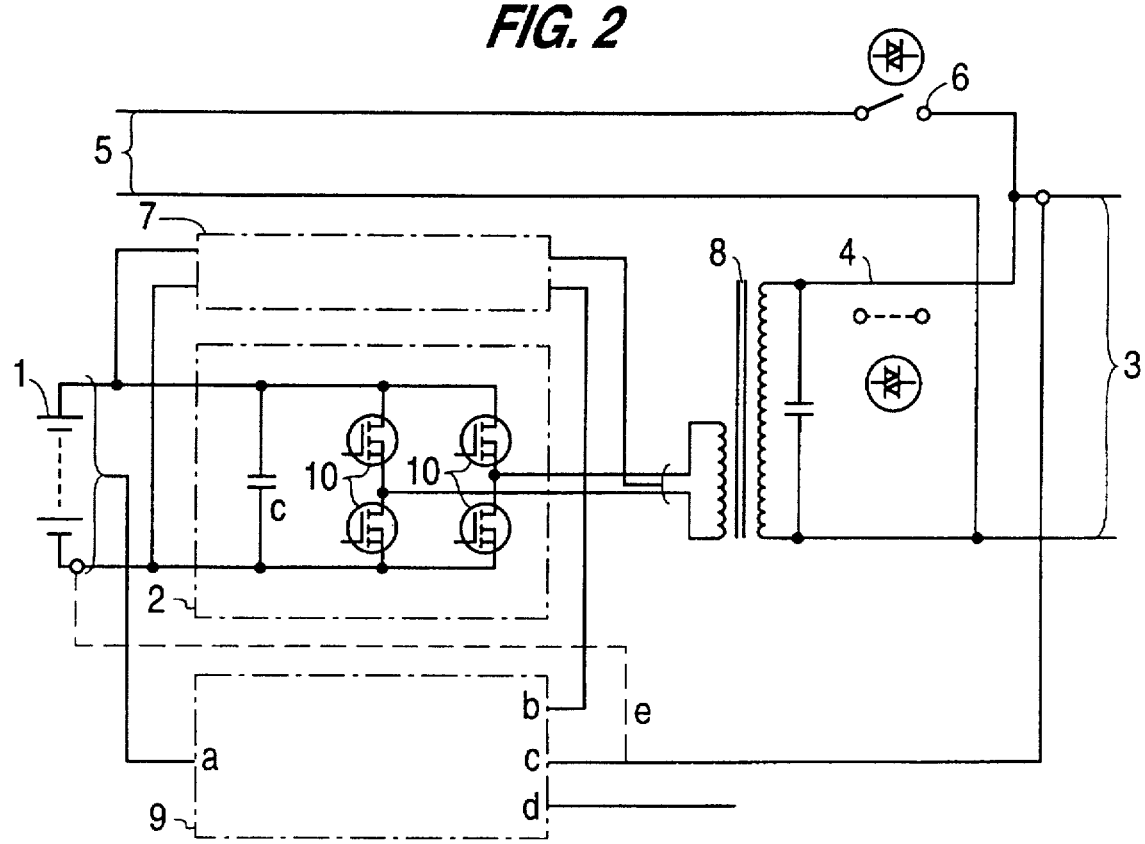
FIG. 2 shows a UPS according to the invention.

FIG. 2 shows a UPS according to the invention, including a battery 1, an inverter 2, switches 4, 6, a charger 7 and a transformer 8. The UPS further comprises a logic unit, such as a microcomputer 9, for performing the necessary control functions which will be described hereinafter. As in the apparatus of FIG. 1, the battery 1 and inverter 2 are disconnected during normal line operation, i.e. no load current passes through them, but the UPS is shown in a connected state to the load. The battery voltage is monitored by the computer unit 9 and is read at the input a. The computer unit can initiate charging of the battery by means of a signal from an output b to the charger 7.

Measuring of the internal impedance of the battery will now be described. When a line failure occurs, the load current $I_L$ is monitored by the computer unit 9 via input c.

Figure 3:
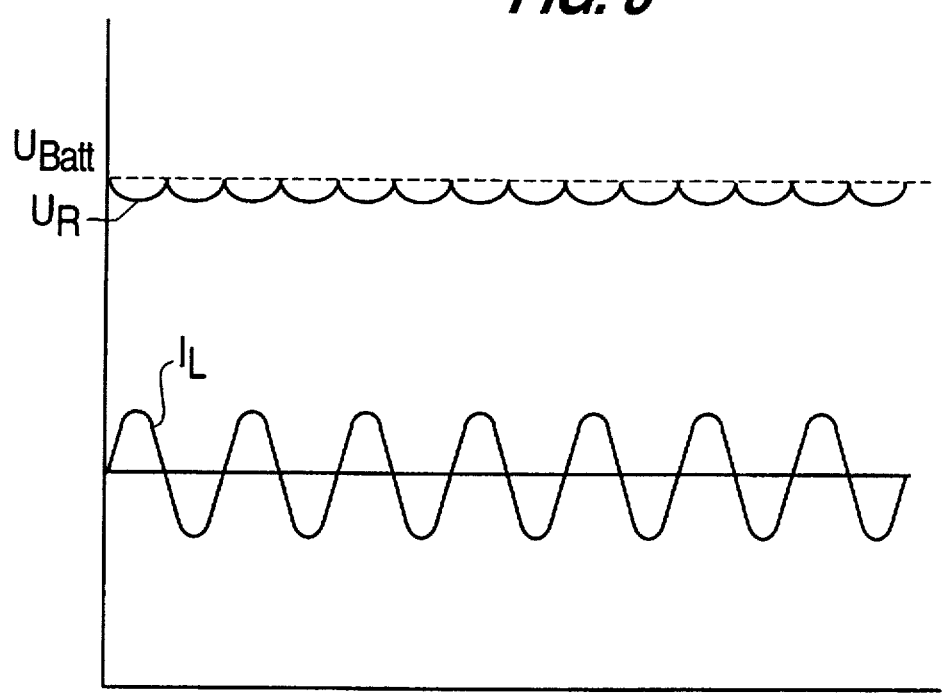
FIG. 3 shows typical current and voltage curves essential to the method of the invention with reference to FIG. 2.

The measured value can be used as an approximation of the battery current when multiplied with the turn ratio N of the transformer 8. The internal impedance can be calculated on the basis of the AC component, ripple $U_R$, generated by the load current on the battery voltage $U_{BATT}$ when the battery is connected to the load: see FIG. 3 shows a typical curve for the battery voltage $U_{BATT}$ at a sinusoidal load current $I_L$. The frequency of this component is twice the mains frequency. By allowing the computer unit to measure, at input a, this AC component and dividing it by the load current for the corresponding period of time, the value $Z_B = U_R/(I_L*N)$ of the internal impedance of the battery is obtained. The measurement of the load current and the AC component may be based on instantaneous values, average values, RMS values, etc. Different algorithms for different measuring methods can easily be programmed into the computer unit 9 to meet different requirements.

When the value of the internal impedance exceeds a predetermined limit, the computer unit may issue an alarm of imminent battery exchange to the connected system via a connection d, and/or initiate shutdown of the connected system.

Alternatively, the battery current can be measured directly (broken line e) in the battery instead of calculating it via the load current. It is an essential feature of the invention that the battery current, and thereby its internal impedance, can be calculated under discharge in a simple and reliable way not impairing the charge of the battery under normal conditions. Naturally, the battery can be tested employing the method of the invention, for instance during servicing, in such a way that the serviceman connects a load on the UPS and disconnects the mains voltage, simultaneously reading the impedance values of the battery.

Figure 4:
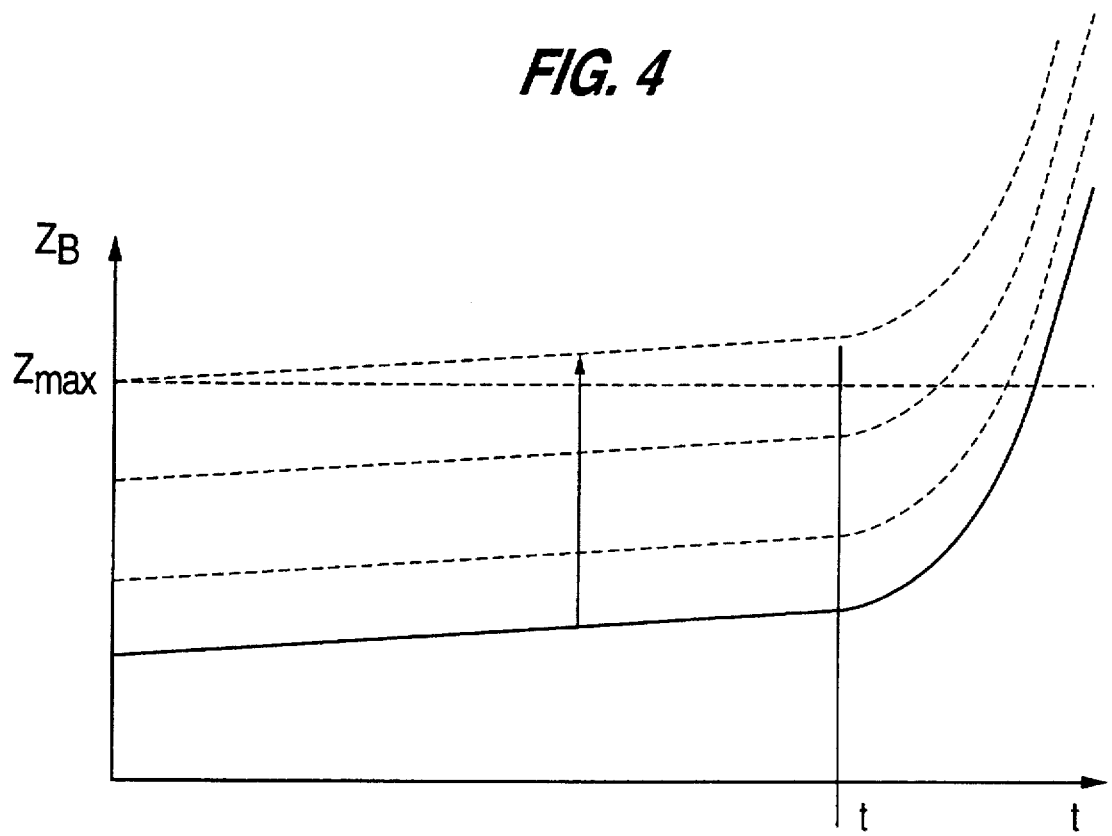
FIG. 4 is a representation of a typical graph for the internal impedance of the battery.

FIG. 4 is a graphical representation of a typical curve for the internal impedance $Z_B$ of the battery on a time axis. The impedance increases during discharge on account of the chemical processes taking place in the battery. The initial level of the impedance is the critical quantity, and a suitable threshold $Z_{max}$ must be selected. When the initial level exceeds the threshold on account of irreversible sulphatation processes, corrosion etc., this increases the risk for inadequate battery capacity, thereby risking the nominal backup time $t_1$ of the UPS, causing shut-off of the connected system.

It is understood by one skilled in the art that the invention is not restricted to the examples given above, but its different embodiments may vary within the scope of the ensuing claims.

What is claimed is:

1. A method of monitoring internal impedance of an accumulator battery in an uninterruptible power supply, said method comprising the steps of:

determining a load current $I_L$ induced by a load connected to said battery and passing through said battery during discharge of said battery to said load;

measuring a corresponding AC voltage component $U_R$ obtained on a battery voltage $U_{BATT}$;

calculating a value of internal impedance $Z_B$ of said battery using said load current $I_L$ and said AC voltage component $U_R$;

comparing said internal impedance value $Z_B$ with a predetermined reference value $Z_{max}$; and determining a condition of said battery in accordance with a result of said comparing step.

2. A method as recited in claim 1, further comprising the step of issuing an alarm signal when said internal impedance value $Z_B$ exceeds said predetermined reference value $Z_{max}$.

3. A method as recited in claim 1, further comprising the step of initiating a shutdown of a connected system when said internal impedance value $Z_B$ exceeds said predetermined reference value $Z_{max}$.

4. A method as recited in claim 2, further comprising the step of initiating a shutdown of a connected system when said alarm signal is issued.

5. A method as recited in claim 1, wherein said determining step comprises the steps of:

directly measuring said load current $I_L$; and calculating a current passing through said battery during the discharge of said battery to said load.

6. A method as recited in claim 2, wherein said determining step comprises the steps of:

directly measuring said load current $I_L$; and calculating a current passing through said battery during the discharge of said battery to said load.

7. A method as recited in claim 3, wherein said determining step comprises the steps of:

directly measuring said load current $I_L$; and calculating a current passing through said battery during the discharge of said battery to said load.

8. An uninterruptible power supply (UPS), comprising:

a battery;

an inverter connected between said battery and a load;

a switch for selectively connecting said battery to said load;

a charger connected to charge said battery; and a logic unit connected to control various control functions, wherein said logic unit monitors an internal impedance of said battery, determines a load current caused by said load and passing through said battery during a discharge of said battery to said load, measures a corresponding AC component of a battery voltage, calculates a value of internal impedance of said battery using said load current and said corresponding AC component and compares said internal impedance value to a predetermined reference value, a condition of said battery being determined on a basis of said comparison.

9. An uninterruptible power supply as recited in claim 8, wherein said logic unit outputs an alarm signal when said internal impedance value of said battery exceeds said predetermined reference value.

10. An uninterruptible power supply as recited in claim 8, wherein said logic unit calculates a current passing through said battery using said load current.

11. An uninterruptible power supply as recited in claim 9, wherein said logic unit calculates a current passing through said battery using said load current.

* * * * *

UNITED STATES PATENT AND TRADEMARK OFFICE
CERTIFICATE OF CORRECTION

PATENT NO. : 5,457,377
DATED : October 10, 1995
INVENTOR(S) : Lennart JONSSON et al.

It is certified that error appears in the above-indentified patent and that said Letters Patent is hereby corrected as shown below:

On the title page: Item [75], please insert --Ove OEHMAN, Helsingfors, Finland--.

Item [19] should read -- Jonsson, et al --.

Signed and Sealed this

Seventh Day of May, 1996

Attest:

BRUCE LEHMAN

*Attesting Officer*   Commissioner of Patents and Trademarks